(12) United States Patent
Gregorski

(10) Patent No.: US 8,179,933 B1
(45) Date of Patent: May 15, 2012

(54) SYSTEMS AND METHODS FOR VISIBLE LIGHT SOURCE EVALUATION

(75) Inventor: Steven Joseph Gregorski, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 57 days.

(21) Appl. No.: 12/915,162

(22) Filed: Oct. 29, 2010

(51) Int. Cl.
*H01S 3/10* (2006.01)
*G01C 8/08* (2006.01)
*G01J 1/42* (2006.01)

(52) U.S. Cl. ........ 372/28; 356/5.01; 356/4.01; 356/229; 372/20.02; 372/29.021; 372/43.01

(58) Field of Classification Search ................ 356/213, 356/217, 229, 5.15, 5.01; 372/26, 28, 38.02, 372/38.07, 43.01; 345/4, 55, 102, 87, 204; 250/226, 214 C, 208.1
See application file for complete search history.

(56) References Cited

U.S. PATENT DOCUMENTS

| | | | | |
|---|---|---|---|---|
| 5,108,183 A * | 4/1992 | Fling et al. | .................... | 356/460 |
| 5,598,491 A * | 1/1997 | Ohya et al. | ....................... | 385/24 |
| 7,420,997 B2 | 9/2008 | Bhatia et al. | ................. | 372/38.07 |
| 7,483,458 B2 | 1/2009 | Bhatia et al. | ................. | 372/38.02 |
| 7,505,492 B2 * | 3/2009 | Gollier et al. | ............ | 372/29.011 |
| 7,529,281 B2 | 5/2009 | Leonardo et al. | | |
| 7,586,960 B2 * | 9/2009 | Hu | .................... | 372/28 |
| 7,729,397 B1 * | 6/2010 | Gollier et al. | ............ | 372/29.021 |
| 7,809,032 B2 | 10/2010 | Fujii et al. | | |
| 7,830,357 B2 * | 11/2010 | Kitaoka et al. | ................. | 345/102 |
| 2005/0162639 A1 * | 7/2005 | Stierle | ........................... | 356/5.15 |
| 2005/0276288 A1 | 12/2005 | Kitaoka et al. | ................. | 372/20 |
| 2006/0215716 A1 * | 9/2006 | Luo et al. | .................. | 372/38.08 |
| 2007/0041409 A1 * | 2/2007 | Sudarshanam et al. | .......... | 372/6 |
| 2008/0225918 A1 | 9/2008 | Achtenhagen et al. | | |
| 2010/0150190 A1 | 6/2010 | Masood et al. | | |

* cited by examiner

*Primary Examiner* — Sang Nguyen
(74) *Attorney, Agent, or Firm* — Svetlana Z. Short

(57) ABSTRACT

Particular embodiments of the present disclosure relate systems and methods for evaluating visible light sources. According to one embodiment, a method of evaluating a visible light source including a semiconductor laser having a gain section, a wavelength selective section, and a phase section includes applying a gain drive signal to the gain section of the semiconductor laser at a gain modulation frequency, and applying a triangular wave drive signal to the wavelength selective section of the semiconductor laser at a wavelength selective modulation frequency that is greater than the gain modulation frequency. The light source emits a plurality of optical output pulses. Output power values of the optical output pulses at a selected wavelength are detected. The output power value of one or more selected output pulses is compared with an output power threshold value to generate an indication of whether the visible light source satisfies an output power specification.

20 Claims, 6 Drawing Sheets

SYSTEMS AND METHODS FOR VISIBLE LIGHT SOURCE EVALUATION

BACKGROUND

1. Field

Embodiments of the present disclosure generally relate to the evaluation of semiconductor lasers. More specifically, the embodiments relate to systems and methods of evaluating the optical output of visible light sources comprising a wavelength conversion device and a semiconductor laser having a gain section, a wavelength selective section, and a phase section.

2. Technical Background

Semiconductor lasers, such as distributed Bragg reflector (DBR) lasers, are being utilized in an increasing number of applications. For example, semiconductor lasers capable of producing optical radiation in the red, blue and green optical spectrums may be incorporated into a laser projector to produce scanned laser images. However, wavelength thermal drift and cavity mode-hopping in semiconductor lasers may adversely affect optical output power and create noticeable defects in the scanned laser image produced by laser scanner system (particularly those emitting wavelength-converted optical radiation in the green spectral range). Therefore, some semiconductor laser packages are driven by a high frequency modulated gain current to minimize the effect of wavelength thermal drift and cavity mode-hopping in the image. However, the complicated electronics necessary to produce such high frequency gain currents are not cost effective or easily implemented into testing procedures of high-volume production environments. For example, high-frequency, high-gain current gain drive signals may require that the test equipment be located very close to the laser under test and may also produce significant electrical noise. Further, the high-frequency, high-gain current gain drive signals may necessitate soldered connections of the laser under test to the evaluation equipment, which may be unacceptable in a high-volume production environment.

Accordingly, a need exists for alternative systems and methods for evaluating visible light sources.

SUMMARY

Generally, embodiments described herein are directed to systems and methods for evaluating a visible light source in a production environment. By way of example and not limitation, a visible light source may comprises one or more semiconductor lasers that are configured to emit radiation at one or more wavelengths that are converted by a wavelength conversion device. The visible light source may be implemented in a laser system, such as a laser projection system, for example. During production of the visible light sources, it may be desirable to perform an evaluation to determine if the visible light sources produced meet particular specifications. Evaluation processes should be efficient so that visible light sources may be rapidly tested to reduce the overall cost of the fabrication process. Those visible light sources satisfying the specifications, such as optical output power and thermal impedance, for example, may be marked as satisfactory and passed on to the next step in the fabrication process. Those not meeting the specifications may be marked as scrap and discarded.

In some laser applications, the gain section of one or more of the semiconductor lasers included in a visible light source may be driven by the application of a high-frequency current (e.g., >25 MHz at 650 mA) to a gain section. The high-frequency gain current may be utilized to minimize wavelength thermal drift and cavity mode-hopping within the semiconductor laser. However, testing each visible light source/semiconductor laser with such high-frequency and high gain current presents significant problems in fully-automated, high-volume manufacturing environments. For example, test methods utilizing high-frequency, high-current drive signals require expensive circuitry, prevents the drive signal from being located in relatively close proximity to the light source under test, and produce undesirable electrical noise.

Generally, embodiments utilize a low frequency gain drive signal to drive a gain section of a semiconductor laser incorporated into a visible light source package. A triangular wave drive signal is applied to a wavelength selective section of the semiconductor laser at a frequency that is greater than the frequency of the gain drive signal to produce a plurality of output pulses that are detected and analyzed to evaluate various properties of the visible light source under test.

In one embodiment, a method of evaluating a visible light source including a wavelength conversion device and a semiconductor laser having a gain section, a wavelength selective section, and a phase section includes applying a gain drive signal to the gain section of the semiconductor laser at a gain modulation frequency, and applying a triangular wave drive signal to the wavelength selective section of the semiconductor laser at a wavelength selective modulation frequency that is greater than the gain modulation frequency. The visible light source emits a plurality of optical output pulses in response to the gain drive signal and the triangular wave drive signal. The method further includes detecting an output power value of individual ones of the plurality of optical output pulses at a selected wavelength, and comparing the output power value of one or more selected output pulses with an output power threshold value to generate an indication of whether the visible light source satisfies an output power specification.

In another embodiment, a system for evaluating a visible light source including a semiconductor laser and a wavelength conversion device optical coupled to the semiconductor laser, the semiconductor laser having a gain section, a wavelength selective section, and a phase section includes a drive electronics controller and an optical power detection and analysis module. The drive electronics controller has a gain section driver and a wavelength selective section driver. The system is programmed such that the gain section driver applies a gain drive signal to the gain section of the semiconductor laser at a gain modulation frequency, and the wavelength selective section driver applies a triangular wave drive signal to the wavelength selective section of the semiconductor laser at a wavelength selective modulation frequency that is greater than the gain modulation frequency. The visible light source emits a plurality of optical output pulses in response to the gain drive signal and the triangular wave drive signal. The system is further programmed such that the plurality of optical output pulses is detected by the optical power detection and analysis module, and an output power value of one or more selected optical output pulses at a selected wavelength are compared with an output power threshold value to generate an indication of whether the visible light source satisfies an output power specification.

In yet another embodiment, a method of evaluating a visible light source including a wavelength conversion device and a semiconductor laser having a gain section, a wavelength selective section, and a phase section includes applying a gain drive signal to the gain section of the semiconductor laser at a gain modulation frequency, and applying a triangular wave drive signal to the wavelength selective section of the semiconductor laser at a wavelength selective modulation frequency that is greater than the gain modulation frequency. The visible light source emits a plurality of optical output pulses in response to the gain drive signal and the triangular wave drive signal. The method further includes detecting an output power value of individual ones of the plurality of optical output pulses at a selected wavelength, and comparing the output power value of one or more selected output pulses with an output power threshold value to generate an indication of whether the visible light source satisfies an output power specification. A gain duty cycle of the gain drive signal may be varied across a duty cycle range, and output power values of optical output pulses associated with a low gain duty cycle are compared with optical output power values of optical output pulses associated with a high gain duty cycle to determine an optical output power value variation. The optical output power value variation is compared with a variation threshold value to generate an indication of whether the visible light source satisfies a thermal impedance specification.

DETAILED DESCRIPTION

Embodiments described herein are directed to systems and methods for evaluating visible light sources and associated semiconductor lasers and wavelength conversion devices using a low frequency periodic gain drive signal applied to the gain section and a triangular wave drive signal to a wavelength selective section of the semiconductor laser. The semiconductor laser emits a plurality of optical output pulses in response to the periodic gain drive signal and the triangular wave drive signal that are converted into higher harmonics by a wavelength conversion device. These pulses are detected and analyzed to determine if the visible light source satisfies particular specification requirements.

Figure 1:
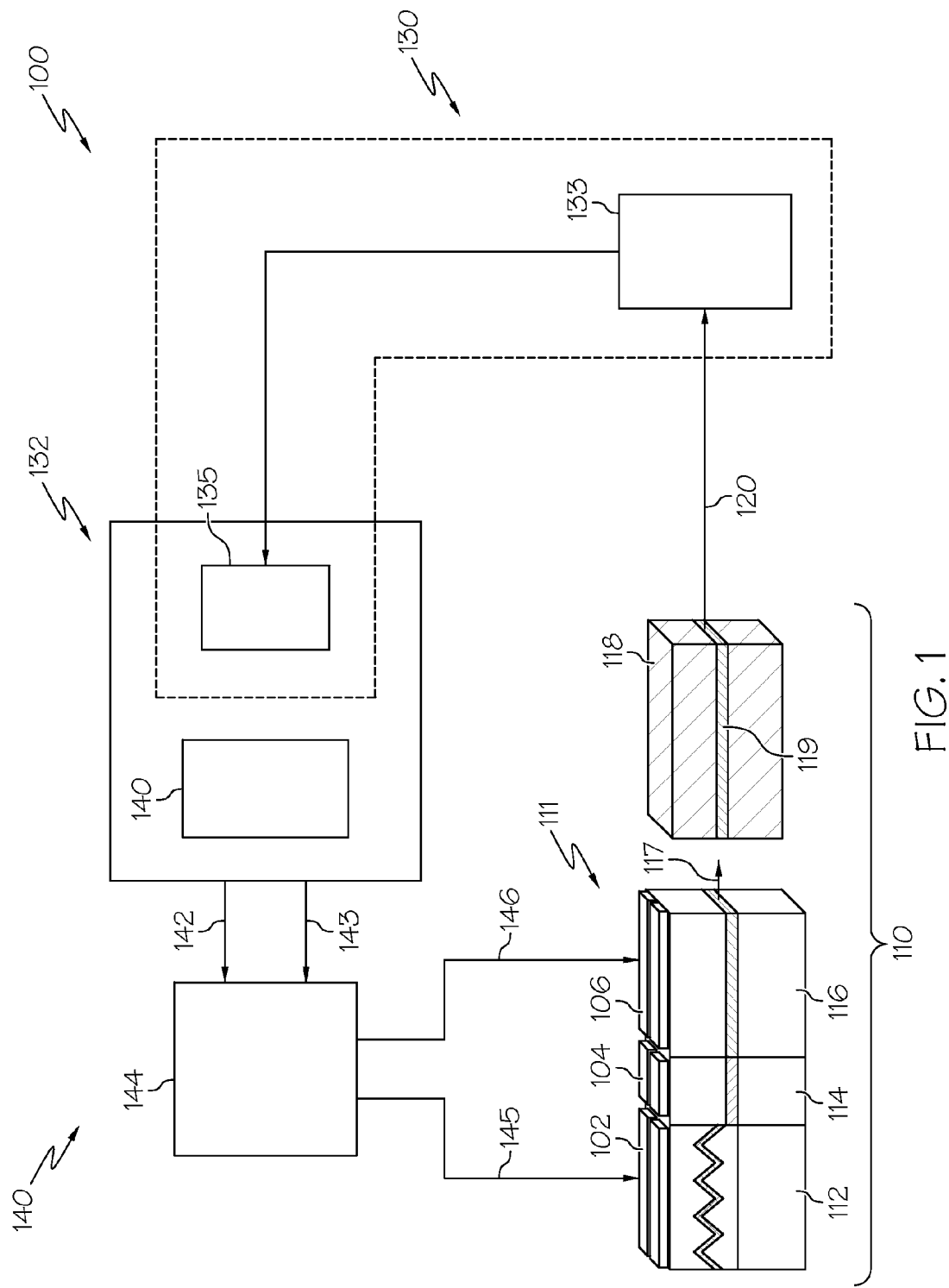
FIG. 1 is a schematic illustration of a system for evaluating a visible light source according to one or more embodiments described and illustrated herein.

A system 100 for evaluating a visible light source 110 under test is illustrated in FIG. 1. The system 100 generally comprises a drive electronics controller 140 and an optical power detection and analysis module 130. As described in more detail below, components of the drive electronics controller 140 and the optical power detection and analysis module 130 may reside in a computing device 132, such as a computer, with a data acquisition module 135 and an analog voltage waveform generator.

The visible light source 110 illustrated in FIG. 1 comprises a semiconductor laser 111 and a wavelength conversion device 118. Although the specific structure of the various types of semiconductor lasers in which the concepts of particular embodiments of the present invention can be incorporated is taught in readily available technical literature relating to the design and fabrication of semiconductor lasers, the concepts of particular embodiments of the present disclosure may be conveniently illustrated with general reference to a three-section DBR-type semiconductor laser 111 illustrated schematically in FIG. 1. In FIG. 1, the DBR laser 111 is optically coupled to the wavelength conversion device 118. The light beam output 117 emitted by the semiconductor laser 111 can be either directly coupled into a waveguide 119 of the wavelength conversion device 180 or can be coupled through collimating and focusing optics, or some other type of suitable optical element or optical system. The wavelength conversion device 118, which may be configured as a non-linear optical crystal, converts the incident light into higher harmonic waves using the non-linear properties of the crystal and outputs the converted signal (e.g., by second harmonic generation (SHG)). This type of configuration is particularly useful in generating shorter wavelength laser beams from longer wavelength semiconductor lasers and can be used, for example, as a visible laser source for laser projection systems.

The DBR laser 111 illustrated schematically in FIG. 1 comprises a wavelength selective section 112, a phase section 114, and a gain section 116. The wavelength selective section 112, which can also be referred to as the DBR section of the laser 111, typically comprises a first order or second order Bragg grating positioned outside the active region of the laser cavity. This section provides wavelength selection, as the grating acts as a mirror whose reflection coefficient depends on the wavelength. The gain section 116 of the DBR laser 111 provides the major optical gain of the laser and the phase section 114 creates an adjustable phase shift between the gain material of the gain section 116 and the reflective material of the wavelength selective section 112. The wavelength selective section 112 may be provided in a number of suitable alternative configurations that may or may not employ a Bragg grating.

Respective control electrodes 102, 104, 106, are incorporated in the wavelength selective section 112, the phase section 114, the gain section 116, or combinations thereof, and are merely illustrated schematically in FIG. 1. It is contemplated that the electrodes 102, 104, 106 may take a variety of forms. For example, the control electrodes 102, 104, 106 are illustrated in FIG. 1 as respective electrode pairs but it is contemplated that single electrode elements 102, 104, 106 in one or more of the sections 112, 114, 116 will also be suitable for practicing particular embodiments of the present invention. The control electrodes 102, 104, 106 can be used to inject electrical current into the corresponding sections 112, 114, 116 of the laser 111. The injected current can be used to alter the operating properties of the laser by, for example, controlling the temperature of one or more of the laser sections, injecting electrical current into a conductively doped semiconductor region defined in the laser substrate, controlling the index of refraction of the wavelength selective and phase sections 112, 114 of the laser 111, controlling optical gain in the gain section 116 of the laser, etc.

The wavelength conversion efficiency of the wavelength conversion device 118 illustrated in FIG. 1 is dependent on the wavelength matching between the semiconductor laser 111 and the wavelength conversion device 118. In one embodiment, the wavelength conversion device 118 is a MgO-doped periodically poled lithium niobate (PPLN) crystal. The wavelength at which the wavelength conversion device 118 converts most efficiently is referred to as the phasematching wavelength. The output power of the higher harmonic light wave 120 emitted from the wavelength conversion device 118 drops drastically when the output wavelength of the laser 111 deviates from the optimal conversion wavelength of the wavelength conversion device 118.

The operational specifications of the visual light may depend on the particular applications that the visible light sources are to be implemented in. For example, the visual light source 110 illustrated in FIG. 1 may be configured such that it emits optical radiation in the green spectral range, and may be used in conjunction with a red and blue semiconductor laser in a laser projection system. The green visible light source 110 should emit a green output laser beam at a output power level that is above an output power level threshold value so that the laser projection system may produce satisfactory scanned laser images.

Still referring to FIG. 1, the drive electronics controller 140 may be configured as an analog voltage waveform generator capable of generating waveforms described herein. The drive electronics controller 140 may comprise a gain section driver that provides a gain drive signal and a wavelength selective section driver that provides a triangular wave drive signal. The drive electronics controller 140 may be configured as an electronics card that is provided in a computer 132, as illustrated in FIG. 1. The drive electronics controller 140 may also be configured as a stand-alone device separate from a computer, such as a function generator.

Also schematically illustrated in FIG. 1 is the gain section and wavelength selective section amplifier drive electronics 144 that are electrically coupled to the drive electronics controller 140 and electrodes 102, 106, of the wavelength selective and gain sections 112, 116, respectively, as shown by arrows 142, 143. The drive electronics controller 140 is configured to provide the respective drive waveforms to the amplifier drive electronics 144 to control the gain and wavelength of the semiconductor laser 111. The amplifier drive electronics 144 amplifies the waveforms provided by the drive electronics controller 140. In one embodiment, the amplifier drive electronics 144 may be a component of the semiconductor laser 111. Alternatively, in another embodiment, the amplifier drive electronics 144 may be a component of the evaluation system 100 and incorporated into the drive electronics controller 140. The drive waveforms cause the semiconductor laser 111 to emit an output beam 117. As an example and not a limitation, the output beam emitted by the semiconductor laser has a wavelength of approximately 1060 nm that is then inputted into the wavelength conversion device 118, where it is frequency-doubled and exits as converted output beam 120 having a converted wavelength of approximately 530 nm.

It is noted that the visible light source 110 should be coupled to the evaluation system 100 such that it is easily connected and disconnected to reduce overall testing time. Any number of electrical connections may be utilized to removably connect the semiconductor laser 111 of the visible light source to the drive electronics controller 140 (and the amplifier drive electronics 144 if a component separate from the semiconductor laser 111).

The optical power detection and analysis module 130 may be configured as one or more components. In the embodiment illustrated in FIG. 1, the optical power detection and analysis module 130 comprises an optical power detector 133 and an analog voltage data acquisition module 135. The optical power detector 133 should be capable of detecting the energy of an optical signal at the desired wavelength and/or range of wavelengths (e.g., wavelengths in the green spectral range). As an example and not a limitation, the optical power detector 133 may include a photodiode configured to detect optical energy at about 560 nm. The optical power detector 133 converts the optical energy into an analog voltage that corresponds to the amount of optical energy detected. The analog signal generated by the optical power detector 133 may then be provided to the analog voltage data acquisition module 135, which may be configured as a data acquisition card that is installed on a computing device 132. The optical power detection and analysis module 130 may also utilize a processor and software residing on the computing device 132. In another embodiment, the analog voltage data acquisition module 135 may be a stand-alone device and not incorporated into the computing device. The analog voltage data acquisition module 135 receives the analog signal from the optical power detector 133 and converts it into digital data. The computing device 132 may perform additional analysis functionality described herein, such as selecting maximum optical output pulses, averaging output power, and other functions as described below. In an alternative embodiment, the optical power detector 133 and the analog voltage data acquisition module 135 may be configured as a single component that detects optical energy and converts an analog signal into digital data that is provided to a computing device 132.

Embodiments described herein drive the gain section 116 with a relatively slow (e.g., a 100 Hz gain modulation frequency) square wave with a maximum gain current and gain duty cycle. By modulating the gain section 116 at a specified gain duty cycle, the maximum gain current and the time-averaged thermal loading of the semiconductor laser 111 may be independently controlled. Additionally, a time-varying triangular wave drive signal is applied to the wavelength selective section 112 to ensure wavelength matching between the semiconductor laser 111 and the wavelength conversion device 118 occurs on a regular, repeating basis. As described in more detail below, the choice of frequency for the triangular wave drive signal applied to the wavelength selective section 112 may be based on the gain drive signal applied to the gain section 116, which may typically be ten times greater than the gain modulation frequency. The two drive signals applied to the gain and wavelength selective sections may be the same for every visible light source that is evaluated, and, in one embodiment, are not adjusted or otherwise altered during the measurement process. In one embodiment, there is no feedback control loop on the gain or wavelength selective sections.

The sampling rate of the optical power detection analysis module 130 should be chosen such that it is greater than the wavelength selective modulation frequency. In one embodiment, the sampling rate of the analog voltage data acquisition module 135 of the optical power detection and analysis module 130 is one hundred times greater than the wavelength selective modulation frequency.

Figure 2:
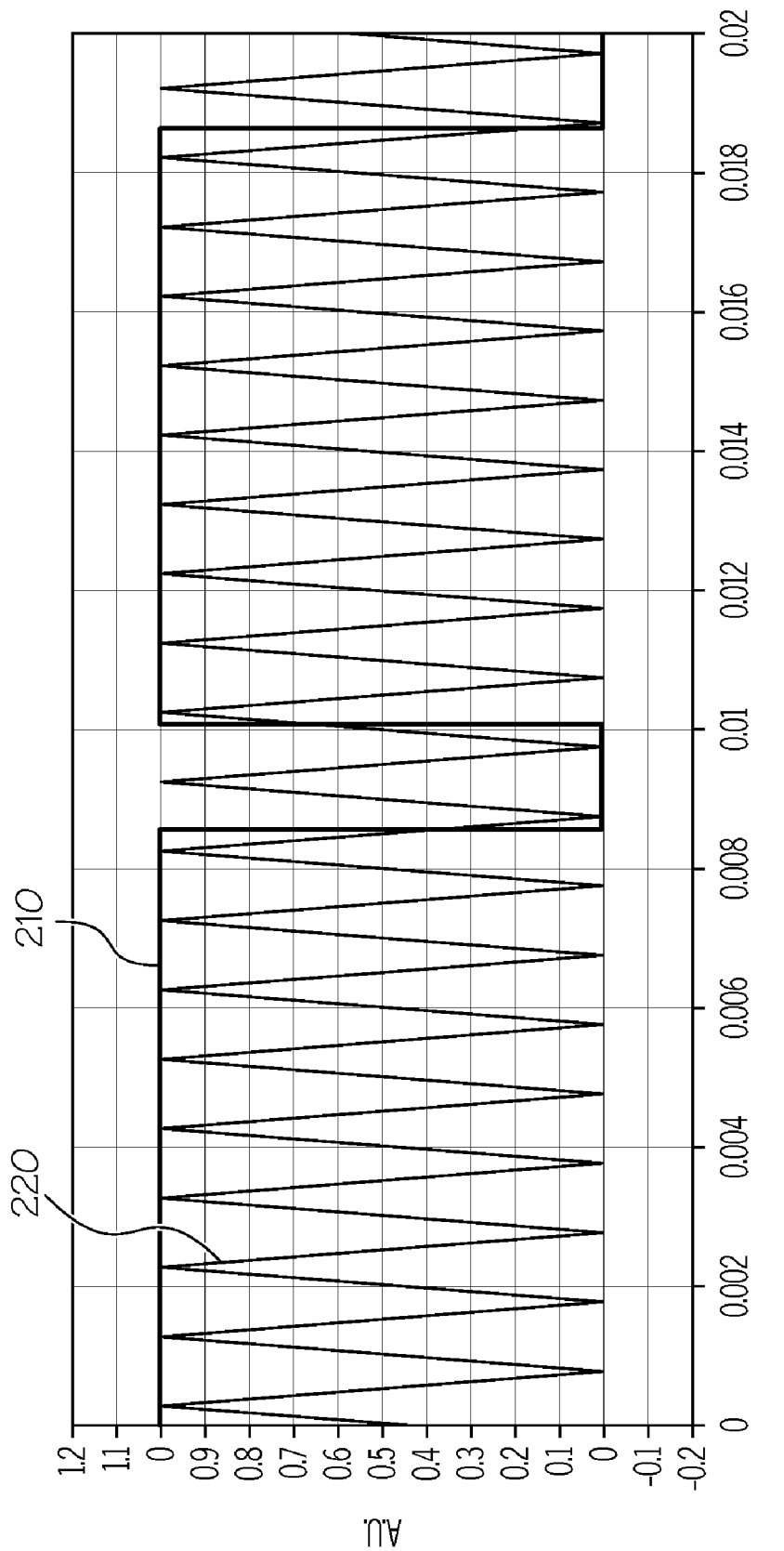
FIG. 2 is a graph illustrating an exemplary gain drive signal and an exemplary triangular wave drive signal according to one or more embodiments described and illustrated herein.

Referring now to FIG. 2, a graph of an exemplary gain drive signal 210 applied to the gain section 116 and an exemplary triangular wave drive signal applied to the wavelength selective section 112 are illustrated. The vertical axis is arbitrary units (A.U.) and corresponds to the electrical current being provided to the gain and wavelength selective sections. The horizontal axis is time. The wavelength selective modulation frequency chosen should be greater than the gain modulation frequency. Because the wavelength selective modulation frequency is greater than the gain modulation frequency, there is a high probability that wavelength matching between the semiconductor laser 111 and the wavelength conversion device 118 will occur during the times when the gain section is powered by the gain drive signal. In one embodiment, the modulation frequency of the triangular wave drive signal is chosen such that it is greater than the gain modulation frequency divided by the gain drive signal duty cycle. For example, the wavelength selective modulation frequency may be about ten times greater than the gain modulation frequency.

In the illustrated example, the gain section is modulated by a 100 Hz square wave with an 85% gain duty cycle. The wavelength selective section is modulated with a 1 KHz triangular wave. It should be understood that the 100 Hz square wave and 1 KHz triangular wave are illustrated and described herein as exemplary frequency values. In one embodiment, the square gain drive signal 210 may have a gain modulation frequency between about 0 Hz and about 1 KHz, while the triangular wave drive signal may have a wavelength selective modulation frequency between about 500 Hz and about 10 KHz. As described in more detail below, a triangular waveform may be chosen to drive the wavelength selective section 112 so that wavelength tuning between the semiconductor laser 111 and the wavelength conversion device 118 is ensured. Although other waveforms may be used, a triangular wave is preferred over a sine wave for the DBR section modulation because the slew rate for a triangular wave is constant. Additionally, a triangular wave is preferred over a sawtooth wave for DBR section modulation because a triangular wave is symmetric on rising and falling edges, and does not require the very high slew rates that a sawtooth wave may require.

Figure 3:
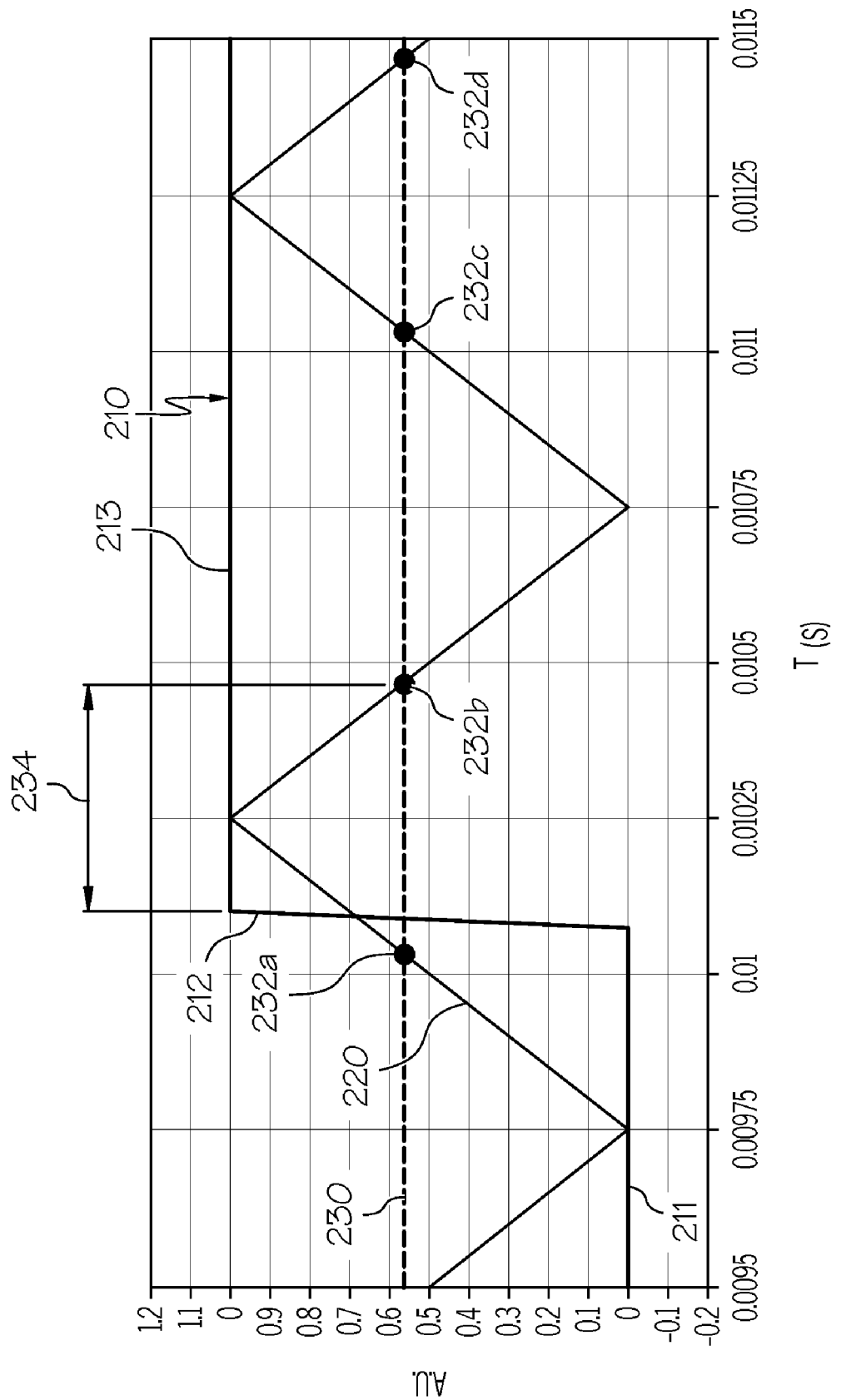
FIG. 3 is a graph illustrating an exemplary gain drive signal, an exemplary triangular wave drive signal and instances of phase matching between a semiconductor laser and a wavelength conversion device according to one or more embodiments described and illustrated herein.

FIG. 3 graphically illustrates how the DBR current to obtain maximum green conversion efficiency (i.e., the current value applied to the wavelength selection section such that the semiconductor laser produces an output beam at the phase matching wavelength of the wavelength conversion device) is obtained twice per cycle of the triangular wave drive signal. As illustrated in FIG. 3, the gain drive signal transitions from a low value 211 to a high value 213 at rising edge 212. The high value portion 213 of the gain drive signal is the maximum applied gain current, while the low value portion 211 may be ground, for example. Dashed line 230 illustrates a hypothetical DBR phase matching current. The semiconductor device will produce an output pulse at instances when the triangular wave drive signal 220 intersects the DBR phase matching current line 230 and the gain drive signal 210 is high and supplying a current to the gain section of the semiconductor laser. For example, the semiconductor laser will produce output pulses at instances 232b, 232c, and 232d. The semiconductor laser does not produce an output pulse at instance 232a because no current is provided to the gain section of the semiconductor laser at that instance.

The timing between the rising edge 212 of the gain drive signal and the next instance of DBR phase matching current may be referred to as a phase delay (illustrated by arrow 234). The phase delay will remain fixed if the gain drive signal 210 and triangular wave drive signal 220 are synchronous with respect to one another, but will vary if they are asynchronous (i.e., the two frequencies are not integer multiples of one another). An example of synchronous modulation would be a wavelength selective modulation frequency of 1 KHz and a gain modulation frequency of 100 Hz, as illustrated in FIG. 2. An example of asynchronous modulation would be a wavelength selective modulation frequency of 1 KHz and a gain modulation frequency of 99 Hz. It may be advantageous to have a varying phase delay between the gain and DBR modulation patterns due to the extra degree of randomness which it provides to the modulation technique.

Figure 4:
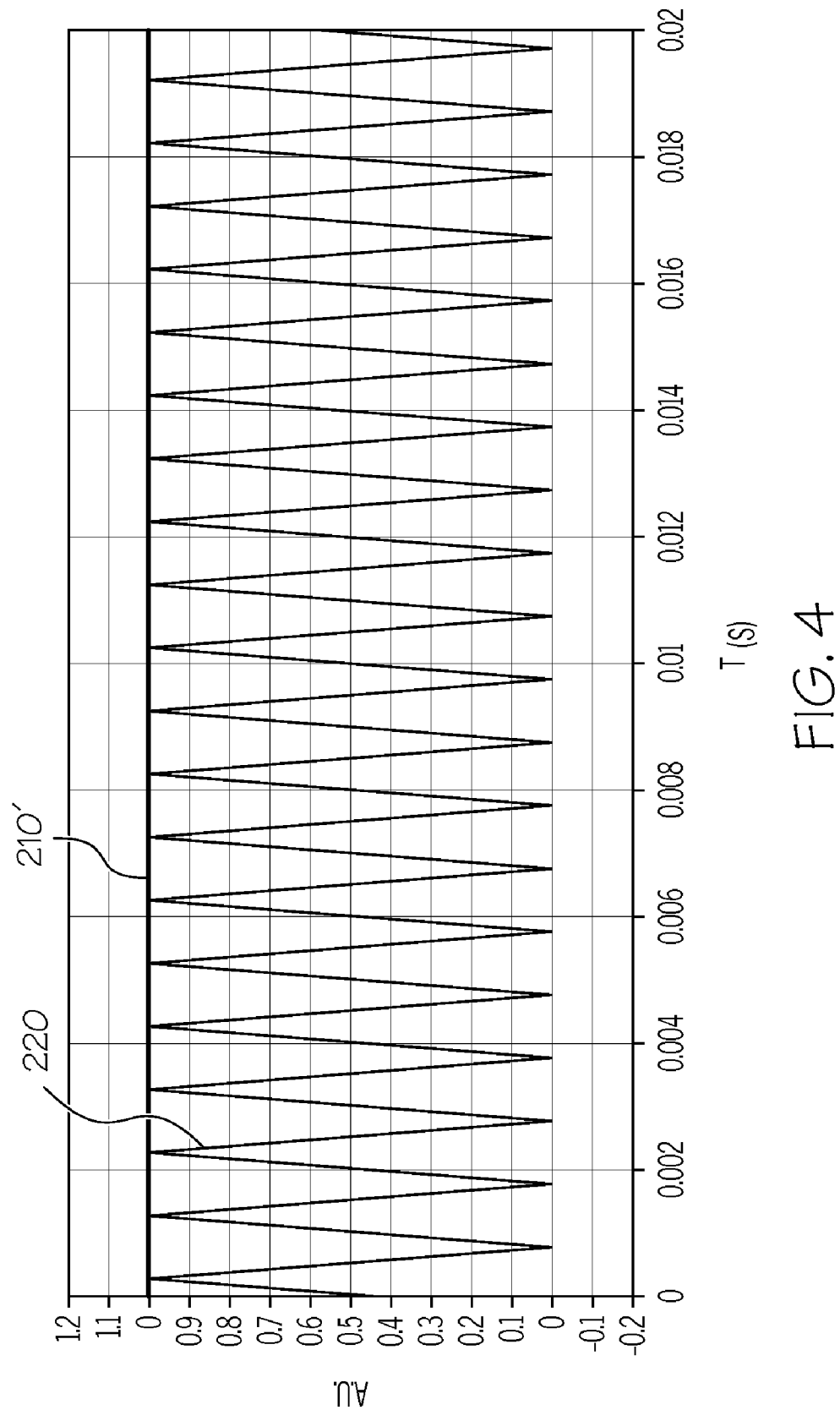
FIG. 4 is a graph illustrating an exemplary CW gain drive signal and an exemplary triangular wave drive signal according to one or more embodiments described and illustrated herein.

FIG. 4 illustrates an exemplary gain drive signal 210' having a gain modulation frequency of 0 Hz such that it is driven in a continuous wave (CW) mode. Therefore, the gain section is driven with an unmodulated gain current during the evaluation. The wavelength selection section is modulated with a 1 KHz triangular wave as depicted in FIG. 2.

Figure 5:
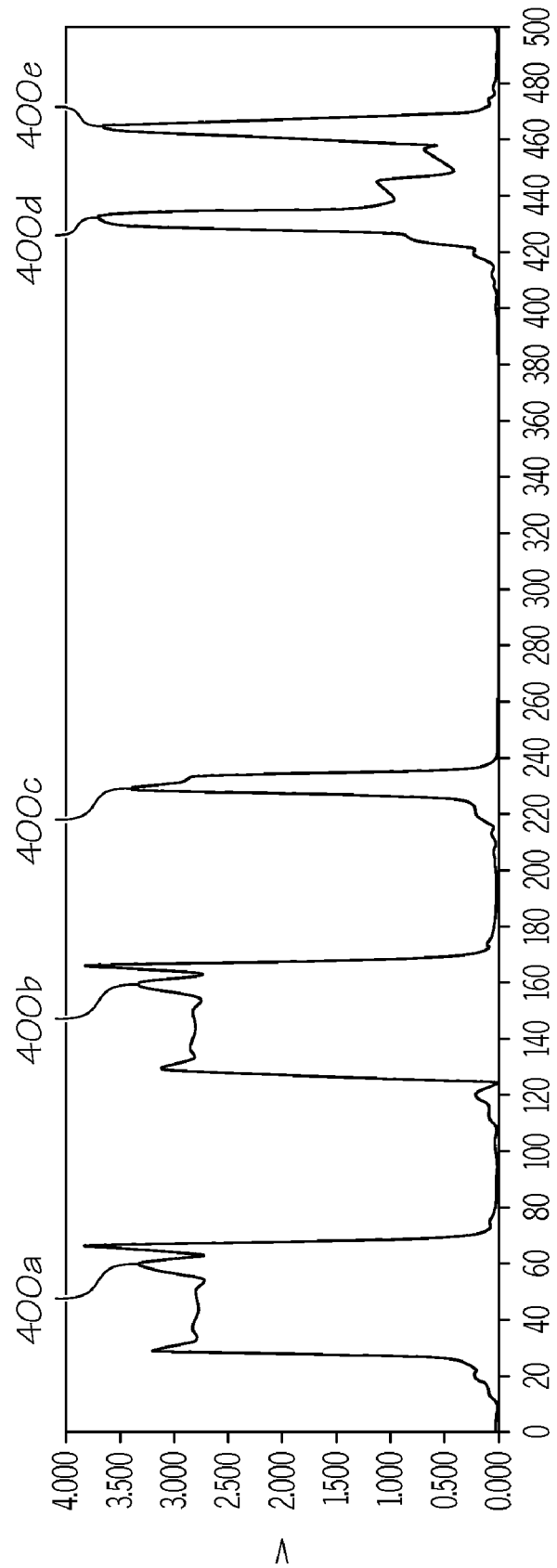
FIG. 5 is a graph illustrating an exemplary output response of a semiconductor laser driven by the gain drive signal and triangular wave drive signal illustrated in FIG. 2.

FIG. 5 graphically illustrates an exemplary green output response from the modulation pattern illustrated in FIG. 2 using a visible light source comprising a semiconductor laser and wavelength conversion device as illustrated in FIG. 1. Shown is the data from the high speed (100 KHz) voltage logging of the optical power meter 133. The vertical axis is the voltage (V) of the analog signal provide by the optical power meter 133, and the horizontal axis is the data samples (#). The voltage corresponds to the optical output power detected by the optical power meter. A block of 500 data points is illustrated. Therefore, individual blocks of 500 data points are processed at a frequency of 100,000/500=200 Hz. A plurality of optical output pulses (400a-400e) are illustrated. Maximum green output occurs whenever the DBR current provided by the triangular wave drive signal is at the appropriate value to obtain phase matching, as described above. No output is present when the gain is not being driven.

The gain current and gain duty cycle of the gain drive signal 210 are adjusted to desired values. As an example and not a limitation, the maximum gain current may be set to 650 mA and the gain duty cycle may be set to 75%. The values chosen may depend on the specific parameters of the semiconductor laser under test. In one embodiment, the peak-to-peak amplitude of the triangular wave drive signal 220 applied to the wavelength selective section may be selected to span a maximum permissible range (e.g., 0 to 150 mA) to ensure that a DBR current operable to emit a pulse at the phase matching wavelength will be obtained.

In another embodiment, the peak-to-peak amplitude of the triangular wave drive signal 220 may be modified on a per unit-under-test basis. The triangular wave drive signal 220 may be tailored to have a peak-to-peak amplitude range that is smaller than the maximum permissible range and centered on the phase matching wavelength of the visible light source 110 under test. This technique may provide a faster result when measuring the optical output power of the visible light source 110, while still employing a modulation scheme that does not require real-time feedback control. Determining an appropriate sub-range of current for the wavelength selective section/DBR heater on a particular semiconductor laser may be achieved in a relatively short time, e.g., under one second. One method of determining the sub-range of current may comprise driving the wavelength selective section 112 over the full permissible range (e.g., 0 to 150 mA, which is the same as a midpoint DBR current of 75 mA with a range of +/75 mA). The optical output power of the visible light source (which may be a green optical output in one embodiment) may be analyzed as a function of DBR current provided by the triangular wave drive signal that provides the best DBR current for the semiconductor laser under test, i.e., the wavelength matching current. After the wavelength matching current is determined, the triangular wave drive signal may be reset such that the midpoint current for the modulation is set to that wavelength matching current and with a smaller range (e.g., +/−10 mA, or other ranges).

Figure 6:
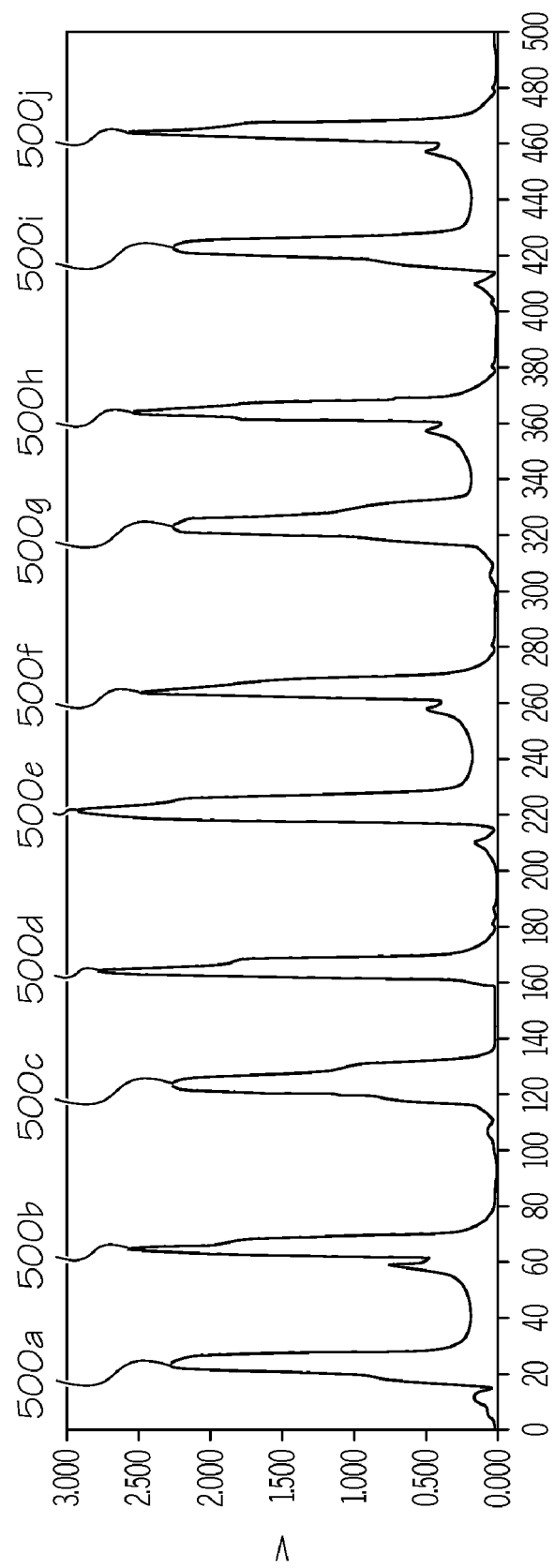
FIG. 6 is a graph illustrating an exemplary output response of a semiconductor laser driven by the gain drive signal and triangular wave drive signal illustrated in FIG. 4.

Similarly, FIG. 6 graphically illustrates an exemplary green output response from the modulation pattern illustrated in FIG. 4 wherein the gain is driven CW and the laser is always on (i.e., a frequency of 0 Hz). A plurality of optical output pulses (500a-500j) are illustrated. Maximum green output occurs whenever the DBR current is at the appropriate value to obtain phase matching.

Referring to both FIGS. 5 and 6, the analog voltage data provided by the optical power meter 133 may be captured and analyzed. In one embodiment, data is analyzed in blocks of 500 acquired data points. It should be understood that data may be analyzed in blocks of more or fewer data points, and that the number of data points in each block may depend on the capabilities of the software and the processor analyzing incoming data. In one embodiment, a peak output power value is determined from every block of 500 data points and are stored for a specific period of time. The number of data blocks and the actual time duration of the full evaluation is related to any thermal time constants of the laser, and may vary for different semiconductor laser designs. Measurement of optical output power should be performed for a sufficient period of time to statistically ensure that the maximum optical output power that the visible light source is capable of producing is sampled and recorded.

The maximum optical output pulse having the maximum optical output power value from each data block is determined and recorded or otherwise selected as the optical output power of the semiconductor laser and visible light source. Using the plurality of pulses shown in FIG. 6 as an example, optical output pulse 500e has the highest optical output power value in the data block illustrated. The optical output power value of optical output pulse 500e may be compared with the maximum output power value of the other data blocks of the evaluation. The optical output pulse having the highest optical output power value of all of the data blocks is selected as the representative optical output pulse.

The selected optical output value having the maximum optical power may then be compared with an output power threshold value to determine if the visible light source under test meets output power specifications. The output power threshold value may be dependent on the type of visible light source package under test and the application for which it is to be utilized. Those visible light sources where the selected optical output value is less than the output power threshold value may be labeled as faulty and discarded, while those where the selected optical output value is greater than the output power threshold value may be labeled as in compliance with the output power specification and selected for further processing.

In another embodiment, the output power values of all (or a selected few) of the optical output pulses of each data block may be averaged to generate an average output power value for each data block that is then compared with the average output power value for the remaining data blocks. The averaged output power value having the highest output power value may be selected as representative of the visible light source. Alternatively, a maximum output power value for each data block obtained over a given measurement time period may be determined and recorded as described above and then averaged. The averaged maximum output power values of each data block may then be compared with the output power threshold value. In this manner, an atypical optical output pulse may be discounted if one did occur.

In an alternative embodiment, the phase section 114 may also be driven by a time-varying drive signal in addition to the wavelength selective section 112. Driving the phase section 114 is such a manner may further scramble the wavelength of the output beam emitted by the semiconductor laser 111. By providing a time-varying phase drive signal to the phase section 114 that is anti-correlated with respect to the triangular wave drive signal applied to the wavelength selective section 112, an additional degree of randomness to the instantaneous laser wavelength tuning may be achieved, which may also improve the overall measurement technique. Anti-correlated means that the frequency of the triangular wave drive signal applied to the wavelength selective section 112 and the phase drive signal are not integer multiples of one another. The phase drive signal may be configured as a triangular wave or other periodic signals. Alternatively, the phase drive signal may be configured as white noise that is applied to the phase section 114. The frequency of the phase drive signal should be greater than the frequency of the drive signal applied to the wavelength selective section 112. As an example and not a limitation, the frequency of the phase drive signal may be about ten times greater than triangular wave drive signal applied to the wavelength selective section 112.

It is also possible to evaluate the thermal properties of the visible light source under test. As an example and not a limitation, the temperature of a 1060 nm DBR semiconductor laser directly influences the infrared output power for a given gain current applied to the gain section. Higher temperatures result in lower IR output, and by extension, lower green optical output power in a frequency doubling device. The temperature of the DBR semiconductor laser is influenced by the electrical power dissipated in the gain section. The electrical power dissipation, in turn, is determined by the gain current and the duty cycle of the gain modulation. Therefore, the measured green optical output of a visible light source is a function of both the gain current and the duty cycle of the gain modulation. Embodiments of the present disclosure may independently control both of these parameters during an evaluation to independently control both the peak gain current and the time-averaged thermal loading of the semiconductor laser. In this manner, drive parameters that mimic how end-users might be expected to operate the visible light source may be duplicated so that the most relevant measured values may be obtained.

The manipulation of gain current and/or gain duty cycle can be used to identify high thermal impedance issues in the visible light source (e.g., solder voiding). By fixing the modulated gain current maximum value of the gain drive signal while performing optical output power measurements at a varying gain duty cycle, embodiments of the present disclosure may be used as a diagnostic tool to also identify visible light sources with out-of-specification thermal impedance. Hypothetically, a visible light source with near zero thermal impedance should measure the same optical output power, regardless of the gain duty cycle of the gain drive signal, as long as the maximum gain current is maintained at a constant value. A visible light source driven with a variable gain duty cycle that measured a large decrease in optical output power as the gain duty cycle was increased (thereby increasing the time-averaged thermal loading) could be rejected as scrap since it likely has a thermal impedance issue due to a manufacturing defect.

The time-average thermal loading test may be performed after the maximum optical output test described above. In one embodiment, the gain section of the semiconductor laser may be driven by a gain drive signal having a low gain duty cycle, such as 50%, for example. Optical output power values may be measured and temporarily stored by the optical power detection and analysis module while the semiconductor laser is driven at the low gain duty cycle. The gain duty cycle may be gradually increased and optical output power values continuously measured and stored until a high, maximum gain duty cycle is reached (e.g., 90% or other value). The optical output power values associated with the low gain duty cycle(s) may be compared with optical output power values associated with the high gain duty cycle(s) to determine an optical output power value variation. The optical output power value variation represents the difference in optical output power between low and high thermal loading. For example, selected measured optical output power values at a low gain duty cycle may be averaged to determine an average low gain duty cycle power value, and selected measured optical output power values at a high gain duty cycle may be averaged to determine an average high gain duty cycle power value. The high gain duty cycle power value may be subtracted from the low gain duty cycle power value to calculate the optical output power value variation. The calculated optical output power value variation may then be compared with a variation threshold value to determine if the visible light source under test meets appropriate thermal impedance specifications, which may depend on the particular design of the visible light source or the application in which it is incorporated.

In embodiments where the gain section is driven at CW gain current, the thermal loading on the semiconductor laser is completely determined by the gain current that is chosen. To test the thermal characteristics of the visible light source driven at CW gain current, the gain current applied to the gain section may be adjusted from a low value to a high value, and optical output power values measured. A difference between the optical output power values at low gain current and the optical output power values at a high gain current is calculated to determine if the visible light source under test satisfies the thermal impedance specifications.

Referring generally to FIG. 1, it is noted that some visible light source designs may use adaptive optics (not shown) to accurately couple the output beam 117 of the semiconductor laser to the waveguide portion 119 of the wavelength conversion device 118. The adaptive optics may be implemented in a visible light source 110 in a variety of configurations, such as a tunable lens or an adjustable mirror. A feedback loop is utilized to continuously adjust the adaptive optics such that the output beam 117 is aligned with the waveguide 119 to maximize green output power. As described above with reference to FIGS. 5 and 6, the analog voltage stream received from the optical power meter 133 may be sampled at a high rate and analyzed in sequential blocks of data (e.g., blocks of 500 data points). If the sample rate is 100 KHz and the data block size is 500 points, then blocks of data may be processed at a frequency of 200 Hz. The peak optical power value from each data block can be numerically determined and made available in software to the adaptive optics control loops such that the output beam 117 may be continuously aligned with the waveguide 119 of the wavelength conversion device 118.

It should now be understood that the embodiments described herein may be utilized to efficiently evaluate optical output capabilities and thermal characteristics of visible light sources comprising semiconductor lasers and wavelength conversion devices. A low frequency periodic gain drive signal is applied to the gain section of the laser and a higher frequency triangular wave drive signal is applied to the wavelength selective section of the semiconductor laser. Both drive signals cause the semiconductor laser to emit a plurality of optical output pulses. One or more optical output pulses having a maximum optical output value is determined and compared with an optical output power threshold value to determine if the visible light source under test is in compliance with an output power specification. In some embodiments, thermal characteristics of the visible light source may be tested by varying a gain duty cycle and/or a gain current to determine if the visible light source is in compliance with a thermal impedance specification. The low frequency signals used to evaluate the visible light sources under test enable the system equipment to be positioned at distances of more than a meter away from the light source, and also produce lower noise levels than the high-frequency, high current drive signals used to drive the semiconductor lasers to produce video-quality images.

It is to be understood that the preceding detailed description is intended to provide an overview or framework for understanding the nature and character of the subject matter as it is claimed. It will be apparent to those skilled in the art that various modifications and variations can be made to the embodiments described herein without departing from the spirit and scope of the disclosure. Thus, it is intended that the present disclosure cover the modifications and variations provided they come within the scope of the appended claims and their equivalents.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention.

For the purposes of describing and defining the present invention it is noted that the terms "substantially," "approximately" and "about" are utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method of evaluating a visible light source comprising a semiconductor laser optically coupled to a wavelength conversion device, the semiconductor laser comprising a gain section, a wavelength selective section, and a phase section, and the method comprising:
   applying a gain drive signal to the gain section of the semiconductor laser at a gain modulation frequency;
   applying a triangular wave drive signal to the wavelength selective section of the semiconductor laser at a wavelength selective modulation frequency that is greater than the gain modulation frequency, wherein the visible light source emits a plurality of optical output pulses in response to the gain drive signal and the triangular wave drive signal;
   detecting an output power value of individual ones of the plurality of optical output pulses at a selected wavelength; and
   comparing an output power value of one or more selected output pulses with an output power threshold value to generate an indication of whether the visible light source satisfies an output power specification by a computing device.

2. The method as claimed in claim 1 further comprising:
   determining a maximum optical output pulse having a maximum output power value; and
   comparing the maximum output power value with the output power threshold value.

3. The method as claimed in claim 1 further comprising:
   determining an average output power value of two or more of individual ones of the plurality of optical output pulses; and comparing the average output power value with the output power threshold value.

4. The method as claimed in claim 1 wherein the wavelength conversion device frequency-doubles an output beam emitted by the semiconductor laser such that the plurality of optical output pulses are in a green spectral range.

5. The method as claimed in claim 4 wherein:
the triangular wave drive signal varies a wavelength of the output of the semiconductor laser; and
the wavelength of the output emitted by the semiconductor laser matches a phase matching wavelength of the wavelength conversion device twice during each period of the triangular wave drive signal while the gain drive signal provides a current to the gain section.

6. The method as claimed in claim 5 wherein:
the method further comprises determining a wavelength matching current for the wavelength conversion device; and
the triangular wave drive signal is characterized by a peak-to-peak amplitude of 20 mA that is centered on the wavelength matching current.

7. The method as claimed in claim 1 wherein:
the gain drive signal comprises a gain duty cycle; and
the wavelength selective modulation frequency is greater than the gain modulation frequency divided by the gain duty cycle.

8. The method as claimed in claim 1 wherein the gain modulation frequency is within a range of about 0 Hz to about 1.0 kHz.

9. The method as claimed in claim 1 wherein the gain drive signal and the triangular wave drive signal are asynchronous with respect to one another.

10. The method as claimed in claim 1 further comprising:
varying a gain duty cycle of the gain drive signal across a duty cycle range;
comparing output power values of optical output pulses associated with a low gain duty cycle with optical output power values of optical output pulses associated with a high gain duty cycle to determine an optical output power value variation; and
comparing the optical output power value variation with a variation threshold value to generate an indication of whether the visible light source satisfies a thermal impedance specification.

11. The method as claimed in claim 1 further comprising applying a phase drive signal to the phase section of the semiconductor laser, wherein the phase drive signal and the triangular wave drive signal applied to the wavelength selective section are anti-correlated.

12. A system for evaluating a visible light source comprising a semiconductor laser and a wavelength conversion device optically coupled to the semiconductor laser, the semiconductor laser comprising a gain section, a wavelength selective section, and a phase section, wherein:
the system comprises a drive electronics controller and an optical power detection and analysis module;
the drive electronics controller comprises a gain section driver and a wavelength selective section driver; and
the system is programmed such that:
the gain section driver applies a gain drive signal to the gain section of the semiconductor laser at a gain modulation frequency,
the wavelength selective section driver applies a triangular wave drive signal to the wavelength selective section of the semiconductor laser at a wavelength selective modulation frequency that is greater than the gain modulation frequency,
the visible light source emits a plurality of optical output pulses in response to the gain drive signal and the triangular wave drive signal, and
the plurality of optical output pulses is detected by the optical power detection and analysis module, and an output power value of one or more selected optical output pulses at a selected wavelength is compared with an output power threshold value to generate an indication of whether the visible light source satisfies an output power specification.

13. The system as claimed in claim 12 wherein the system is further programmed such that a maximum optical output pulse having a maximum output power value is determined and compared with the output power threshold value.

14. The system as claimed in claim 12 wherein the system is further programmed such that an average output power value of two or more of individual ones of the plurality of optical output pulses is determined and compared with the output power threshold value.

15. The system as claimed in claim 12 wherein the wavelength conversion device frequency-doubles an output beam emitted by the semiconductor laser such that the plurality of optical output pulses are in a green spectral range.

16. The system as claimed in claim 15 wherein:
the triangular wave drive signal varies a wavelength of the output emitted by the semiconductor laser; and
the wavelength of the output emitted by the semiconductor laser matches a phase matching wavelength of the wavelength conversion device twice during each period of the triangular wave drive signal while the gain drive signal provides a current to the gain section.

17. The system as claimed in claim 16 wherein:
the system is further programmed to detect a wavelength matching current for the wavelength conversion device; and
the triangular wave drive signal is characterized by a peak-to-peak amplitude that is centered on the wavelength matching current.

18. The system as claimed in claim 12 wherein:
the gain section driver applies the gain drive signal at a gain duty cycle; and
the wavelength selective modulation frequency is greater than the gain modulation frequency divided by the gain duty cycle.

19. The system as claimed in claim 12 wherein the system is further programmed such that:
the gain section driver applies the gain drive signal to the gain section of the semiconductor laser at a gain duty cycle that varies across a duty cycle range;
output power values of optical output pulses associated with a low gain duty cycle are compared with optical output power values of optical output pulses associated with a high gain duty cycle to determine an optical output power value variation; and
the optical output power value variation is compared with a variation threshold value to generate an indication of whether the semiconductor laser satisfies a thermal impedance specification.

20. A method of evaluating a visible light source comprising a semiconductor laser optically coupled to a wavelength conversion device, the semiconductor laser comprising a gain section, a wavelength selective section, and a phase section, and the method comprising:
applying a gain drive signal to the gain section of the semiconductor laser at a gain modulation frequency and a gain duty cycle;

applying a triangular wave drive signal to the wavelength selective section of the semiconductor laser at a wavelength selective modulation frequency, wherein the wavelength selective modulation frequency is greater than the gain modulation frequency divided by the gain duty cycle, and the visible light source emits a plurality of optical output pulses in response to the gain drive signal and the triangular wave drive signal;

detecting an output power value of individual ones of the plurality of optical output pulses at a desired wavelength;

comparing an output power value of one or more selected output pulses with an output power threshold value to generate an indication of whether the visible light source satisfies an output power specification;

varying the gain duty cycle of the gain drive signal across a duty cycle range; comparing output power values of optical output pulses associated with a low gain duty cycle with optical output power values of optical output pulses associated with a high gain duty cycle to determine an optical output power value variation; and comparing the optical output power value variation with a variation threshold value to generate an indication of whether the visible light source satisfies a thermal impedance specification by a computing device.

* * * * *